US011990944B1

(12) United States Patent
Zhang et al.

(10) Patent No.: US 11,990,944 B1
(45) Date of Patent: May 21, 2024

(54) COMMUNICATION NETWORKS INCLUDING QUANTUM DOT COHERENT COMB LASERS, AND ASSOCIATED METHODS

(71) Applicant: Cable Television Laboratories, Inc., Louisville, CO (US)

(72) Inventors: Haipeng Zhang, Broomfield, CO (US); Mu Xu, Broomfield, CO (US); Zhensheng Jia, Superior, CO (US); Luis Alberto Campos, Superior, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 288 days.

(21) Appl. No.: 17/650,644

(22) Filed: Feb. 10, 2022

Related U.S. Application Data

(60) Provisional application No. 63/147,884, filed on Feb. 10, 2021.

(51) Int. Cl.
*H04B 10/70* (2013.01)
*H01S 5/10* (2021.01)
*H01S 5/34* (2006.01)

(52) U.S. Cl.
CPC ........... *H04B 10/70* (2013.01); *H01S 5/1032* (2013.01); *H01S 5/3412* (2013.01)

(58) Field of Classification Search
CPC ...... H04B 10/70; H01S 5/3412; H01S 5/1032
See application file for complete search history.

(56) References Cited

U.S. PATENT DOCUMENTS

| | | | |
|---|---|---|---|
| 2019/0036304 A1* | 1/2019 | Lu | H01S 5/0687 |
| 2019/0109643 A1* | 4/2019 | Campos | H04L 69/18 |
| 2019/0245622 A1* | 8/2019 | Campos | H04J 14/04 |
| 2019/0326995 A1* | 10/2019 | Zhou | H04J 14/02 |
| 2019/0393962 A1* | 12/2019 | Zhang | G02F 1/21 |

* cited by examiner

*Primary Examiner* — Nicholas P Celani
(74) *Attorney, Agent, or Firm* — PdZ Patent Law, PLLC

(57) ABSTRACT

A method for generating optical communication signals in a communication network includes (1) generating at least a first optical tone and a second optical tone using a quantum dot (QD) coherent comb laser (CCL), the first and second optical tones having different respective wavelengths, (2) modulating the first optical tone according to a first modulation signal to generate a first communication signal, and (3) modulating the second optical tone according to a second modulation signal to generate a second communication signal.

19 Claims, 15 Drawing Sheets

COMMUNICATION NETWORKS INCLUDING QUANTUM DOT COHERENT COMB LASERS, AND ASSOCIATED METHODS

CROSS REFERENCE TO RELATED APPLICATIONS

This application claims the benefit of priority to U.S. Provisional Patent Application Ser. No. 63/147,884 filed on Feb. 10, 2021, which is incorporated herein by reference.

BACKGROUND

Growth in data intensive applications, such as high-definition streaming video applications, cloud computing applications, data storage applications, Internet of Things (IoT) applications, and Big Data applications, has increased the need for data transmission. Converged communication networks, which implement two or more different communication technologies, e.g., wireline and wireless communication technologies, are anticipated to play a major role in meeting this need. These communication networks have large capacity capability and low deployment costs, which makes them strong candidates for next generation communication networks, including next generation access communication networks and next generation mobile xHaul communication networks, where xHaul refers to any one of backhaul, fronthaul, and midhaul.

On the wireline communication network side, coherent optical communication networks, which modulate phase and amplitude of light and transmit the light across two polarizations, are expanding from transmission applications to edge/access applications, due to superiority of coherent optical communication networks relative to traditional optical communication networks. For example, a coherent optical communication network may achieve a higher data rate, greater receiver sensitivity, and higher spectral efficiency than an otherwise similar optical communication network that does not employ coherent optics technology. Furthermore, coherent optical communication networks may advantageously implement multi-level advanced modulation formats and digital signal processing to effectively compensate for linear transmission impairments, such as chromatic dispersion (CD) and polarization mode dispersion (PMD).

On the wireless communication network side, fifth generation (5G) wireless communication technologies, including millimeter wave (mmWave) technologies and massive IoT technologies, offer tremendous benefits such as high throughput, mobility, and flexibility.

Different 5G xHaul solutions have been studied, and radio-over-fiber (RoF) xHaul technology, which is considered a low-cost and scalable solution, has gained popularity in multi-service broadband access networks. In a RoF communication network, multiple wireless communication services can be allocated and controlled in a central hub, e.g., a central office (CO), and ready-to-use analog signals can be delivered to remote access units (RAUs) or wireless base stations (BSs) with identical protocols and interfaces, which promises to greatly simplify and reduce the cost of cellular wireless communication base stations. 5G mmWave small cell wireless communication networks may especially benefit from the low attenuation and the low cost of RoF technology.

DETAILED DESCRIPTION OF THE EMBODIMENTS

Converged communication networks generally transfer data at least partially using optical communication signals. Accordingly, an optical light source is a crucial building block of most converged communication networks. Traditional converged communication networks rely on a single laser light source that generates a small number of optical carriers. An optical frequency comb light source, which generates an optical frequency comb, may be used in place of a single laser light source. An optical frequency comb is a series of discrete and equally spaced optical frequency lines, which may be referred to as optical tones. Each optical tone may be used as a separate optical carrier, and a single optical frequency comb light source can therefore support many optical communication links. However, an optical frequency comb must be stable, e.g., the optical tones must have substantially constant amplitudes, for use with high performance communication technologies, such as coherent optics and millimeter wave (mmWave) technologies. Such stability may be achieved by mode-locking a laser generating the optical frequency comb, which achieves a fixed phase correlation between longitudinal modes of the laser's cavity and thereby causes optical tone amplitudes to be substantially constant. However, conventional mode-locking optical frequency comb light sources used in communication networks are relatively complex and costly. For example, an external cavity laser requires optical feedback elements for mode-locking, and such assembly is relatively expensive and complex.

Disclosed herein are communication networks and associated methods which at least partially overcome the above discussed drawbacks of conventional communication networks including an optical frequency comb light source. The new communication networks advantageously include a quantum dot (QD) coherent comb laser (CCL) which generates an optical frequency comb of many optical tones having different respective wavelengths. In contrast with optical frequency comb light sources of conventional communication networks, the QD CCL of the new communication networks is capable of self-mode-locking, i.e., the QD CCL can achieve fixed correlation between longitudinal modes of the laser's cavity without external devices. Therefore, the new converged communication networks including a QD CCL may advantageously be simpler and less costly than traditional converged communication networks including an optical frequency comb light source. Additionally, the optical frequency comb generated by the QD CCL may be sufficiently stable to support high performance communication technologies, such as coherent optics and mmWave technologies, without use of external stabilization elements.

Figure 1:
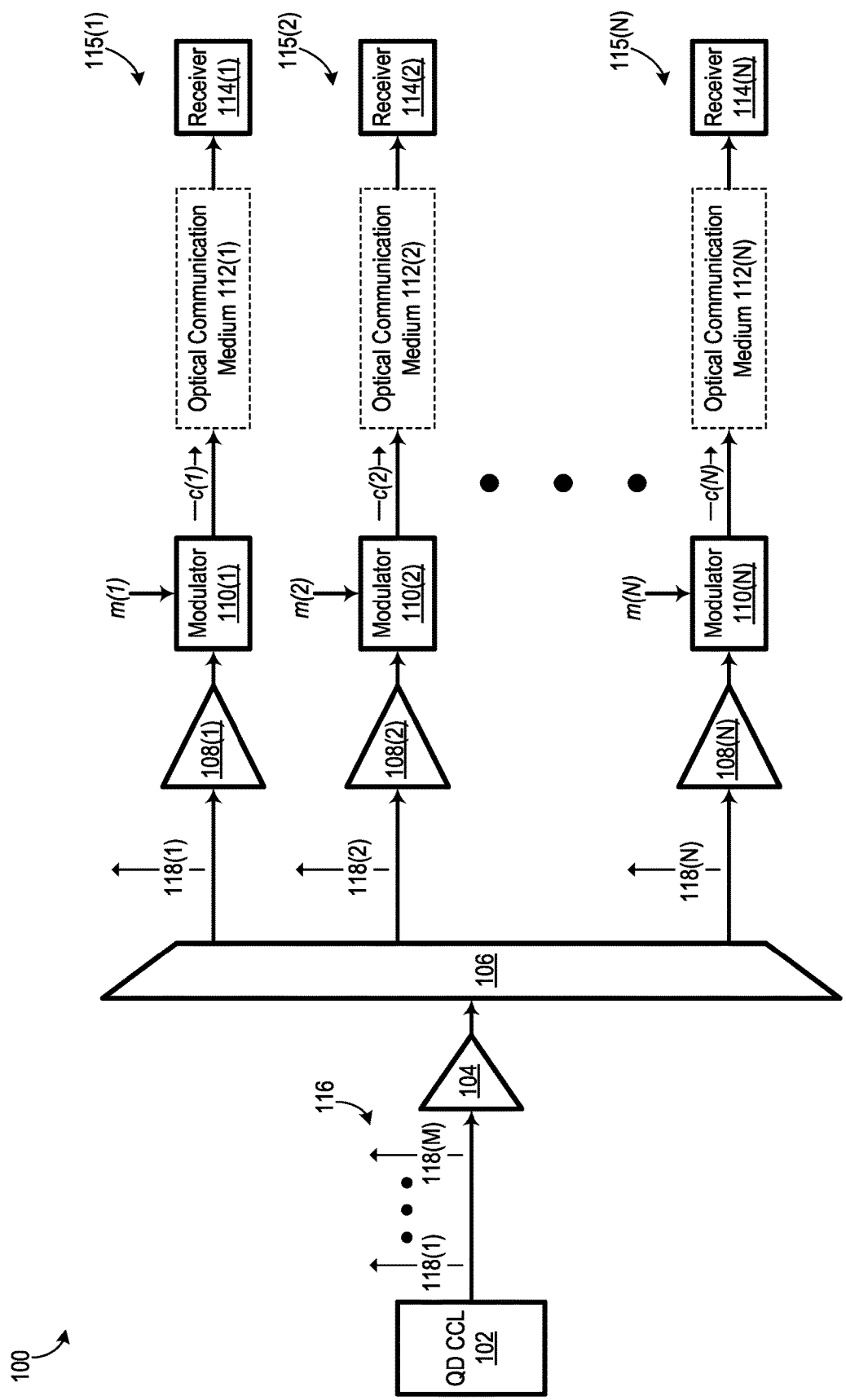
FIG. 1 is a block diagram of a communication network including a quantum dot (QD) coherent comb laser (CCL), according to an embodiment.

FIG. 1 is a block diagram of a communication network 100, which is one embodiment of the new communication networks including a QD CCL. Communication network 100 includes a QD CCL 102, an amplifier 104, a wavelength selection device 106, N amplifiers 108, N modulators 110, N optical communication mediums 112, and N receivers 114, where N is a positive integer corresponding to the number of communication links 115 supported by communication network 100. In this document, specific instances of an item may be referred to by use of a numeral in parentheses (e.g., amplifier 108(1)) while numerals without parentheses refer to any such item (e.g., amplifiers 108). QD CCL 102 is configured to generate an optical frequency comb 116 of M optical tones 118, where each optical tone 118 has a different respective wavelength. M is an integer greater than one, and M is greater than or equal to N. In some embodiments, adjacent optical tones have a separation of 6.25 Gigahertz (GHz) or 25 GHz.

Figure 2:
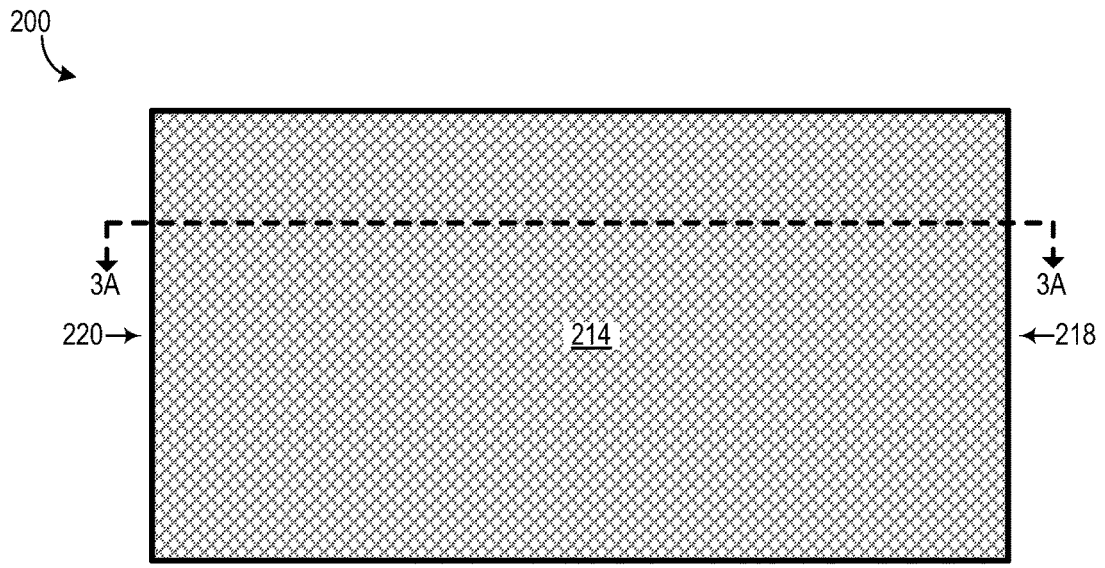
FIG. 2 is a top plan view of one embodiment of the QD CCL of the FIG. 1 communication network.
Figure 3:
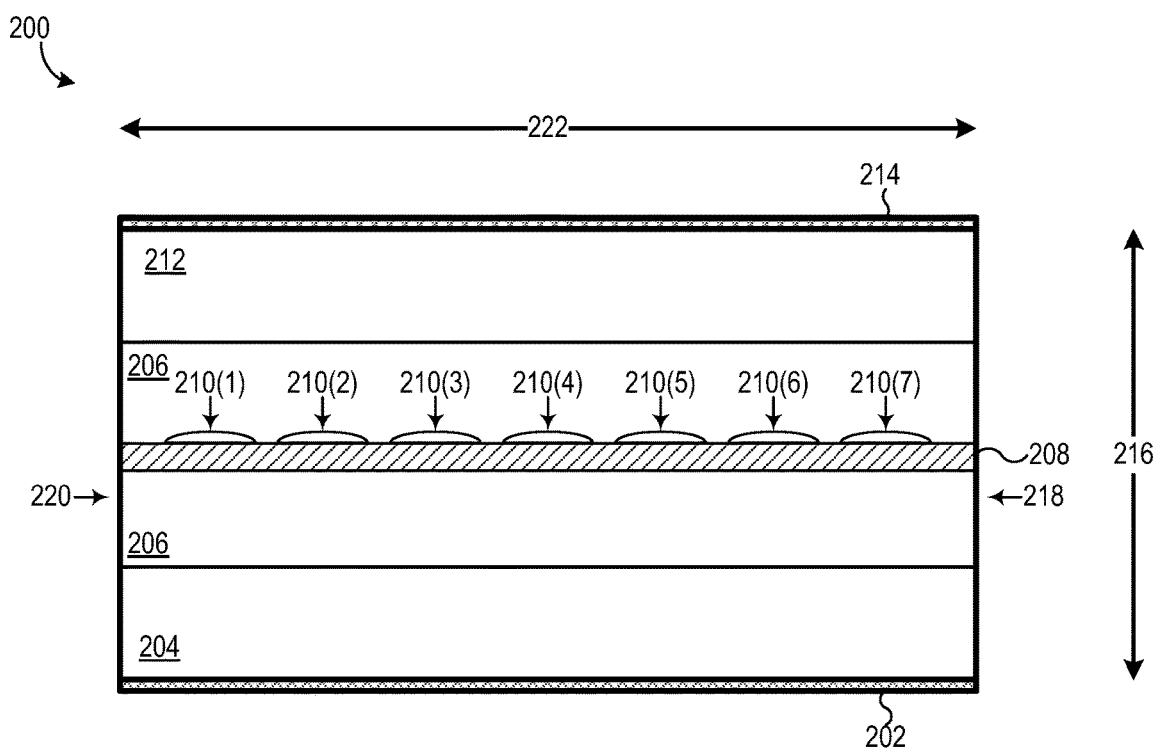
FIG. 3 is a cross-sectional view of the FIG. 2 QD CCL.

QD CCL 102 includes a plurality of quantum dots (not shown in FIG. 1), where each quantum dot is capable of functioning as an independent light source and two or more quantum dots may be capable of generating light at different wavelengths. FIGS. 2 and 3 collectively illustrate a QD CCL 200, which is one possible embodiment of QD CCL 102. It should be appreciated, though, that QD CCL 102 is not limited to the example embodiment of FIGS. 2 and 3. FIG. 2 is a top plan view of QD CCL 200, and FIG. 3 is a cross-sectional view of QD CCL 200 take along line 3A-3A of FIG. 2. QD CCL 200 includes a first electrode 202, a first cladding layer 204, a waveguide core 206, a waveguide sublayer 208, a plurality of quantum dots 210, a second cladding layer 212, and a second electrode 214.

Waveguide core 206 is formed, for example, of an Indium Gallium Arsenic Phosphorus (InGaAsP) material, and in some embodiments waveguide core 206 has a nominal thickness of 170 nanometers (nm) in a direction 216 (see FIG. 3). Waveguide sublayer 208 is embedded in waveguide core 206, and waveguide sublayer 208 is formed, for example, of a Gallium Phosphorus (GaP) material. Quantum dots 210 are formed on waveguide sublayer 208, and quantum dots 210 are formed, for example, of an Indium Arsenic (InAs) material. Although only seven quantum dots 210 are shown in FIG. 3 for illustrative clarity, it is anticipated that QD CCL 200 will typically include additional quantum dots. For example, some embodiments of QD CCL 200 include tens, hundreds, thousands, or more, quantum dots 210. Additionally, while only a single layer of quantum dots 210 is shown in FIG. 3 for illustrative clarity, QD CCL 200 may include a plurality of layers of quantum dots 210, such as stacked in direction 216. For example, certain embodiments of QD CCL 200 includes five layers of quantum dots 210 stacked in direction 216 with a collective thickness in direction 216 of about 10 nm. In certain embodiments, first cladding layer 204 is formed of an Indium Phosphorus (InP) material with an n-type doping, and second cladding layer 212 in formed of an InP material with a p-type doping.

First electrode 202 provides an electrical interface to first cladding layer 204, and second electrode 214 provides an electrical interface to second cladding layer 212. Although first and second electrodes 202 and 214 are each depicted as being uniform layers of conductive material, first electrode 202 and/or second electrode 214 may have a different configuration. For example, in some alternate embodiments, one or more of first electrode 202 and/or second electrode 214 are formed of a plurality of conductive structures, such as a plurality of wires or similar electrically conductive elements. Additionally, while QD CCL 200 is illustrated as having a rectangular shape, QD CCL 200 could be modified to have a different shape.

QD CCL 200 forms opposing first and second facets 218 and 220 on opposing ends of QD CCL 200, where the first and second facets 218 and 220 are separated from each other in a direction 222 that is orthogonal to direction 216. Quantum dots 210 generate light when QD CCL 200 is electrically biased via electrodes 202 and 214, e.g., by applying a direct current (DC) electrical power source across first and second electrodes 202 and 214. The light is reflected within waveguide core 206 and generates an optical frequency comb due to constructive interference, and the light exits facets 218 and 220. A separation between tones 118 is at least partially a function of length of waveguide core 206 in direction 222. Importantly, QD CCL 200 is self-mode-locking, and an optical frequency comb generated by QD CCL 200 may therefore be sufficiently stable for use in communication network 100 without requiring use of mode-locking elements external to QD CCL 200. The fact that light exits both facets 218 and 220 enables QD CCL 200 to provide two different optical frequency combs, such as for two different communication networks. However, some embodiments of QD CCL 200 include a mirror or other reflective structure (not shown) on one of facets 218 and 220, and light exits solely the facet of QD CCL 200 that does not include a mirror or reflective structure. Additionally, QD CCL 200 may include one or more other structures (not shown) on first facet 218 and/or second facet 220, e.g., an anti-refractive coating, such as to improve performance of QD CCL 200 and/or to help interface QD CCL 200 with an external optical element. QD CCL 200 is optionally mounted on a carrier structure (not shown), and QD CCL 200 optionally further includes a temperature control device (not shown), such as a thermoelectric cooler (TEC), to promote stable operation.

Referring again to FIG. 1, QD CCL 102 is optically coupled to wavelength selection device 106, such as by an optical cable, such that wavelength selection device 106 receives optical frequency comb 116 from QD CCL 102. Amplifier 104 is optically coupled in series between QD CCL 102 and wavelength selection device 106, and amplifier 104 is configured to amplify optical frequency comb 116 before wavelength selection device 106 receives the optical frequency comb. Amplification of optical frequency comb 116 may be desired, for example, in embodiments where optical tones 118 have small amplitudes. However, amplifier 104 could be omitted such that wavelength selection device 106 receives optical frequency comb 116 without amplification. In some embodiments, amplifier 104 is a semiconductor optical amplifier (SOA) or an erbium doped fiber amplifier (EDFA).

Wavelength selection device 106 is optically coupled to modulators 110, and wavelength selection device 106 is configured to direct optical tones 118 to modulators 110. In some embodiments, wavelength selection device 106 is configured to direct each optical tone 118 to a respective modulator 110, such as illustrated in FIG. 1. In some other embodiments, wavelength selection device 106 is configured to direct only a subset of optical tones 118 to modulators 110, such that some optical tones 118 generated by QD CCL 102 are not used as optical carriers in communication network 100. In some alternate embodiments, one or more optical tones 118 generated by QD CCL 102 are used for a purpose other than as an optical carrier, such as a seed light source for an optional additional laser (not shown). Wavelength selection device 106 is, for example, a wavelength selective switch (WSS) or a chip-enhanced wavelength selective switch (EWSS).

Figure 4:
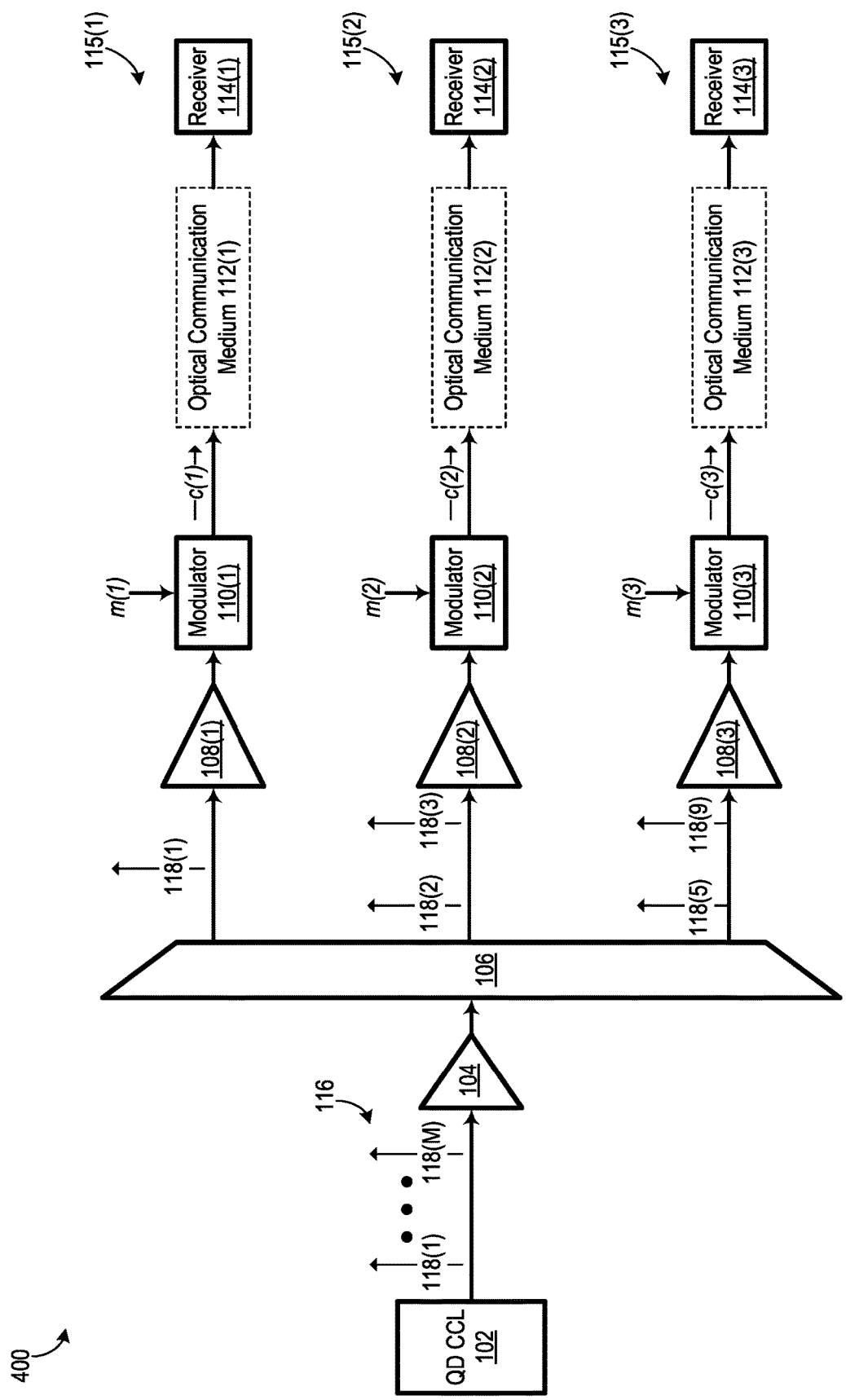
FIG. 4 is a block diagram of an alternate embodiment of the FIG. 1 communication network where a wavelength selection device is configured to direct a plurality of optical tones to a common modulator.

FIG. 1 depicts wavelength selection device 106 directing each optical tone 118 to a respective modulator 110. However, wavelength selection device 106 could be configured to direct two or more optical tones 118 to a common modulator 110. For example, FIG. 4 is a block diagram of a communication network 400, which is an alternate embodiment of communication network 100. N is equal to three in communication network 400, and communication network 400 therefore supports three communication links 115. Wavelength selection device 106 is configured to direct (1) a single optical tone 118(1) to modulator 110(1), (2) two optical tones 118(2) and 118(3) to modulator 110(2), and (3) two optical tones 118(5) and 118(9) to modulator 110(3). It should be noted that wavelength selection device 106 need not be configured to direct solely sequential optical tones 118 to a common modulator 110. For example, while wavelength selection device 106 is configured to direct consecutive optical tones 118(2) and 118(3) to modulator 110(2), wavelength selection device 106 is configured to direct non-consecutive optical tones 118(5) and 118(9) to modulator 110(3), in the FIG. 4 embodiment. In this document, two optical tones 118 are consecutive if there is no optical tone 118 of optical frequency comb 116 having a wavelength that is between the respective wavelengths of the two optical tones. Conversely, two optical tones 118 are non-consecutive if there is at least one optical tone having a wavelength between the respective wavelengths of the two optical tones.

Referring again to FIG. 1, some embodiments of wavelength selection device 106 are configured to dynamically change how optical tones 118 are directed to modulators 110, such as in response to changing operating conditions of communication network 100 or changing needs of clients of communication network 100. For example, assume that (1) optical communication medium 112(N) includes free space optics, (2) wavelength selection device 106 is currently directing optical tone 118(20) to modulator 110(N), (3) fog is interfering with transmission of communication signal c(N) through free space, and (4) optical tone 110(20) has a wavelength that is relatively prone to attenuation by fog. Wavelength selection device 106 may change its configuration to direct a different optical tone 118 to modulator 110(N) that is less prone to attenuation by fog than optical tone 118(20), to help mitigate the impact of fog on transmission of communication signal c(N).

Figure 5:
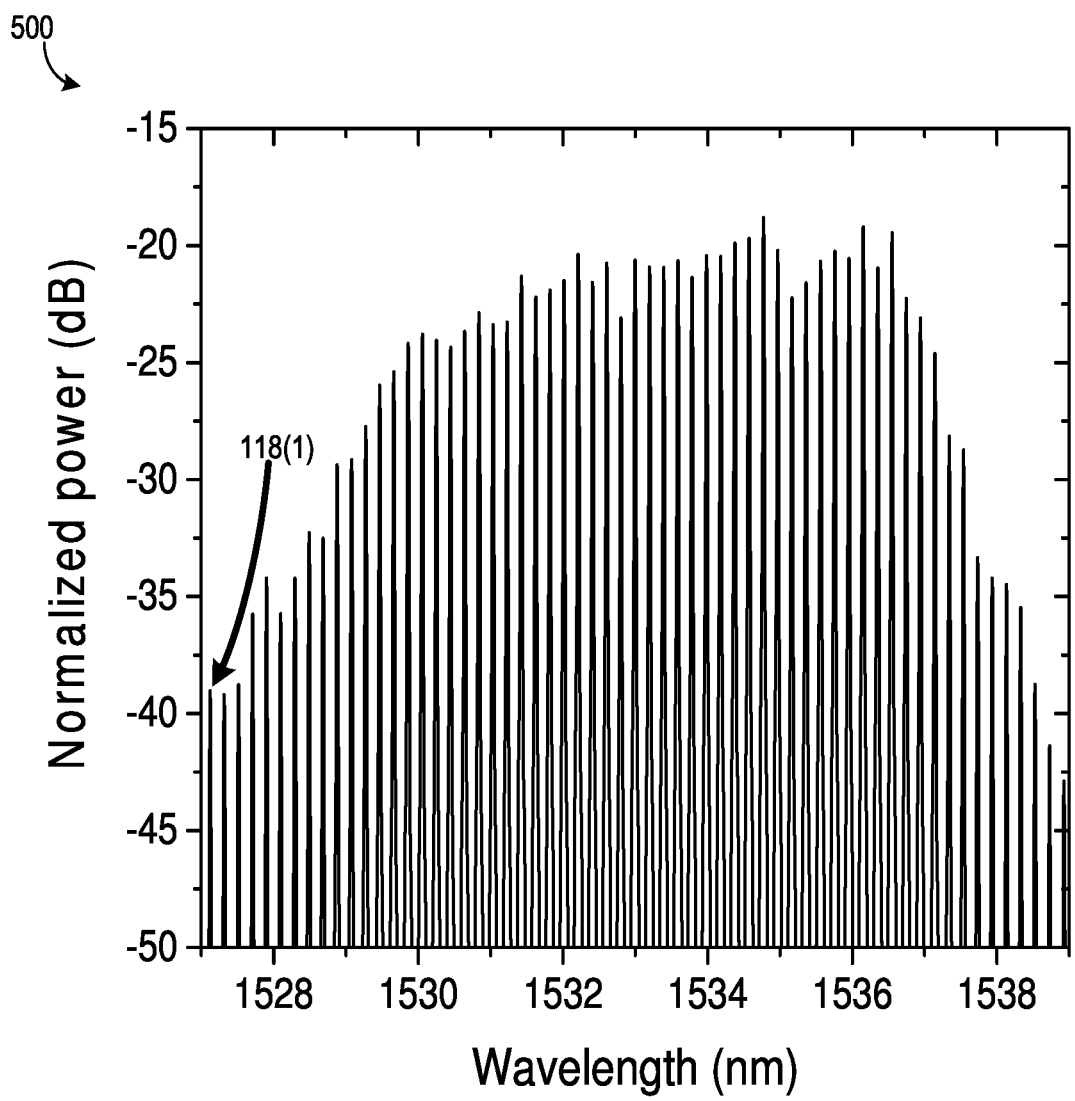
FIG. 5 is a graph of power versus wavelength of one example optical frequency comb.

Optical tones 118, as generated by QD CCL 102, may have differing amplitudes. For example, FIG. 5 is graph 500 of normalized power in decibels (dB) verses wavelength of one example embodiment of optical frequency comb 116. Only one instance of optical tones 118, i.e., optical tone 118(1), is labeled in FIG. 5 for illustrative clarity. Magnitude of optical tones 118 significantly varies among the optical tones in the FIG. 5 example. Amplifiers 108, however, can achieve a desired amplitude of optical tones 108 before the optical tones are received by modulators 110. In particular, each amplifier 108 amplifies the one or more optical tones 118 directed by wavelength selection device 106 to its respective modulator 110, before the one or more optical tones 118 are received by the modulator 110. As such, each amplifier 108 is optically coupled in series between wavelength selection device 106 and a respective modulator 110. However, one or more amplifiers 108 may omitted without departing from the scope hereof, such as when amplification of optical tones 118 is not required. In some embodiments, each amplifier 108 is a SOA or an EDFA.

Each modulator 110 is configured to modulate the one or more optical tones 118 directed to the modulator by wavelength selection device 106 according to a respective modulation signal m to generate a respective communication signal c, where each communication signal c is an optical communication signal. For example, in communication network 100 (FIG. 1), modulator 110(1) is configured to modulate optical tone 118(1) by modulation signal m(1) to generate communication signal c(1), and modulator 110(2) is configured to modulate optical tone 118(2) by modulation signal m(2) to generate communication signal c(2). As another example, in communication network 400 (FIG. 4), modulator 110(2) is configured to modulate optical tones 118(2) and 118(3) by modulation signal m(2) to generate communication signal c(2), and modulator 110(3) is configured to modulate optical tones 118(5) and 118(9) by modulation signal m(3) to generate communication signal c(3).

Each modulation signal m complies, for example, with a wireline communication protocol or a wireless communication protocol. Examples of communication protocols that modulation signals m may comply with include, but are not limited to, a coherent optics communication protocol, a data over cable service interface specification (DOCSIS) communication protocol, digital subscriber line (DSL) communication protocol, an ethernet passive optical network (EPON) communication protocol, a gigabit passive optical network (GPON) communication protocol, a fourth generation (4G) cellular wireless communication protocol (e.g., a long term evolution (LTE) communication protocol, a fifth generation (5G) cellular wireless communication protocol, a sixth generation (6G) cellular wireless communication protocol, a mmWave cellular wireless communication protocol, a Citizens Broadband Radio Service (CBRS) cellular wireless communication protocol, or a C-B and cellular wireless communication protocol), a satellite wireless communication protocol (e.g., associated with a very low earth orbit (VLEO) satellite, a low earth orbit (LEO) satellite, a medium earth orbit (MEO) satellite, or a geostationary equatorial orbit (GEO) satellite), a Wi-Fi wireless communication protocol, a Bluetooth wireless communication protocol, a long range (LoRa) wireless communication protocol, and a Zigbee wireless communication protocol. In some embodiments, one or more modulation signals m are baseband modulation signals, and in certain embodiments, one or more modulation signals m are generated by combining a baseband signal and an intermediate frequency signal to synthesize a high frequency modulation signal.

Communication signals c may be analog or digital. In some embodiments, one or more communication signals c are analog wireless communication signals having a format that is ready for wireless transmission by a recipient wireless base station, such that minimal or no processing of the communication signals is required at the wireless base station. For example, in some embodiments, one or more communication signals c is an analog wireless communication signal complying with a cellular wireless communication protocol, a Wi-Fi wireless communication protocol, a satellite wireless communication protocol, a Bluetooth wireless communication protocol, a LoRa wireless communication protocol, or a Zigbee wireless communication protocol. Such analog format of communication signals c advantageously promotes simplicity of a recipient wireless base station by reducing or eliminating the need for the recipient wireless base station to perform signal processing.

In some embodiments, two or more modulation signals m comply with different respective communication protocols such that communication network 100 is a converged communication network. For example, in some embodiments of communication network 100, at least one modulation signal m complies with a wireline communication protocol and at least one modulation signal m complies with a wireless communication protocol, such that communication network 100 is a converged wireline and wireless communication network.

Figure 6:
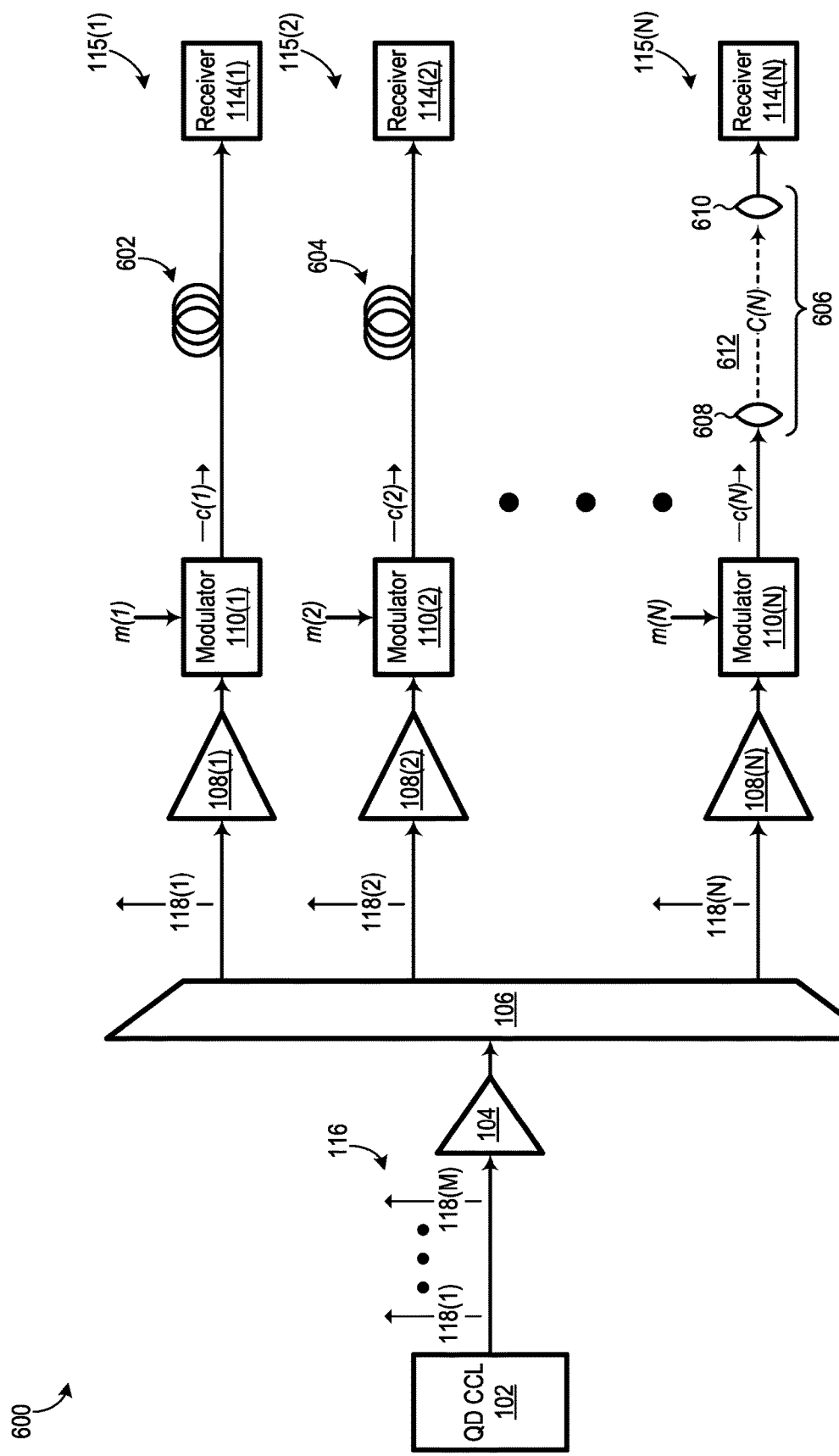
FIG. 6 is a block diagram of an embodiment of the FIG. 1 communication network where optical communication mediums are embodied by optical cables and free space optics.

Each optical communication medium 112 is configured to transmit the communication signal c generated by its respective modulator 110 to a respective receiver 114. For example, optical communication medium 112(1) is configured to transmit communication signal c(1) from modulator 110(1) to receiver 114(1), and optical communication medium 112(2) is configured to transmit communication signal c(2) from modulator 110(2) to receiver 114(2). Each optical communication medium 112 includes, for example, one or more optical cables and/or free space optics. For example, FIG. 6 is a block diagram of a communication network 600, which is an embodiment of communication network 100 where (1) optical communication medium 112(1) is embodied by an optical cable 602, (2) optical communication medium 112(2) is embodied by an optical cable 604, and optical communication medium 110(N) is embodied by free space optics 606. Free space optics 606 includes lenses 608 and 610 separated by free space 612, and optical communication signal c(N) travels from lens 608 to lens 610 through free space 612.

Referring again to FIG. 1, each receiver 114 is configured to receive a respective communication signal c. For example, receiver 114(1) is configured to receive communication signal c(1) from modulator 110(1) via optical communication medium 112(1), and receiver 114(2) is configured to receive communication signal c(2) from modulator 110(2) via optical communication signal 112(2). In some embodiments, one or more of receivers 114 are incorporated with or associated with another device, including but not limited to, a fiber node, a remote terminal, an optical network unit (ONU), an optical network termination (ONT), a digital subscriber line access multiplexer (DSLAM), a network switch, a network router, a network hub, a server, a network storage device, a network appliance, a modem termination system (MTS), a data center, a hyperscale, a cellular wireless base station, a wireless core network, a satellite wireless ground station, a Wi-Fi wireless base station, a Bluetooth wireless base station, a LoRa wireless base station, a Zigbee wireless base station, or user equipment (UE) (e.g., a mobile telephone, a computer, a set-top device, a data storage device, an Internet of Things (IoT) device, an entertainment device, a computer networking device, a smartwatch, a wearable device with communication capability, a medical device, a security device, a monitoring device, and a wireless access device).

Figure 7:
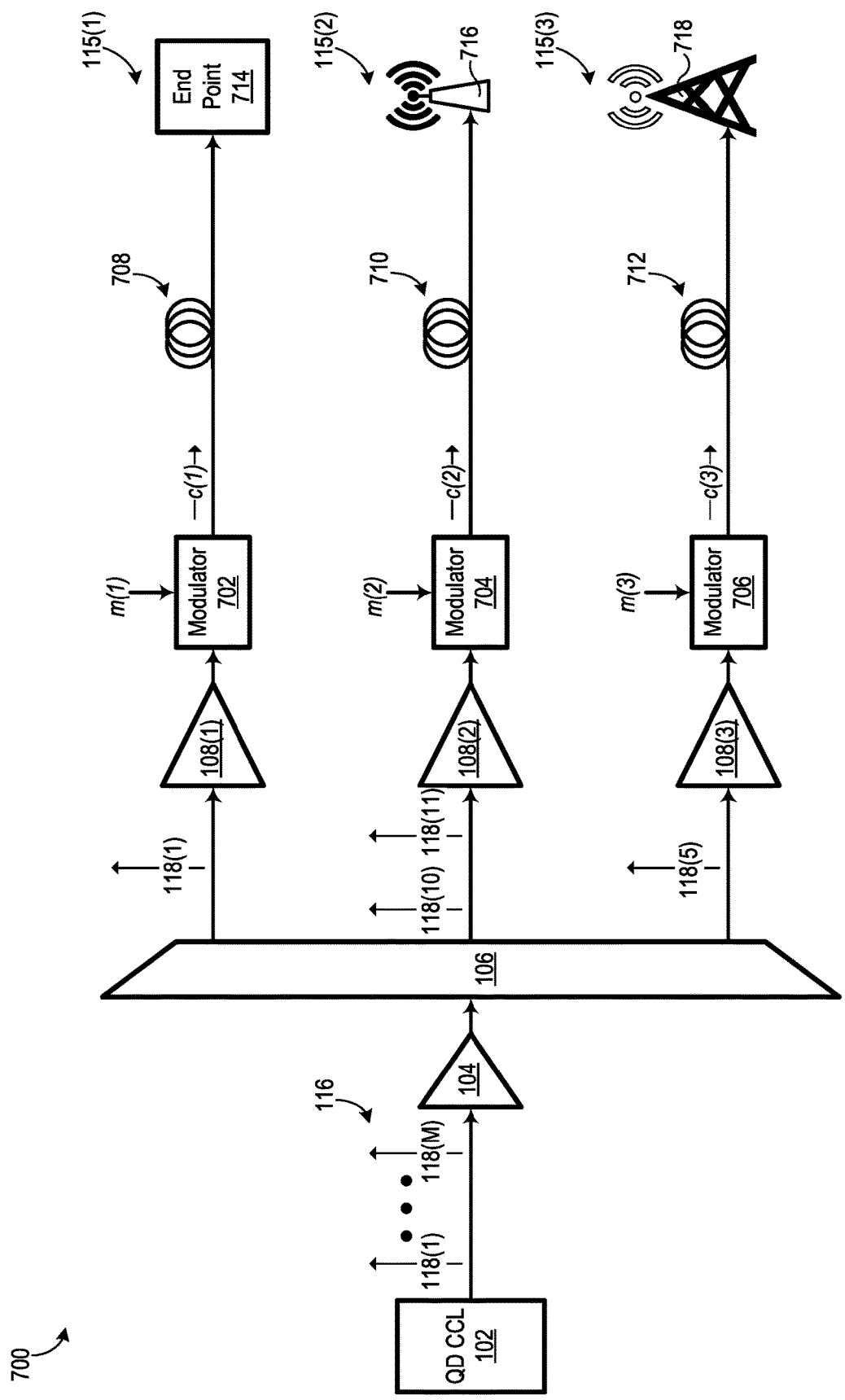
FIG. 7 is a block diagram of an embodiment of the FIG. 1 communication network supporting each of a coherent optics communication protocol, a millimeter wave (mmWave) cellular wireless communication protocol, and a Citizens Broadband Radio Service (CBRS) cellular wireless communication protocol.
Figure 8:
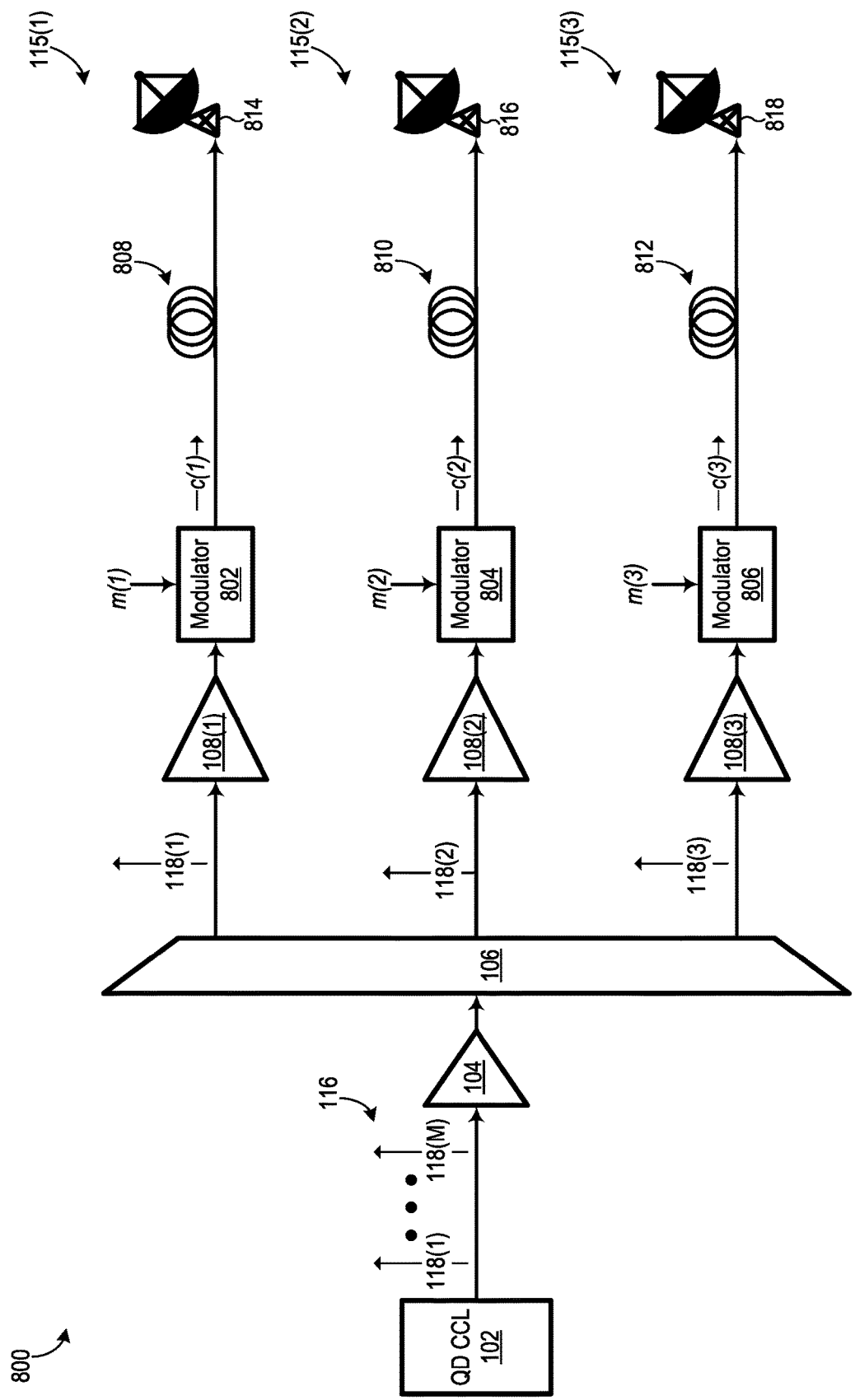
FIG. 8 is a block diagram of an embodiment of the FIG. 1 communication network supporting satellite wireless communication.
Figure 9:
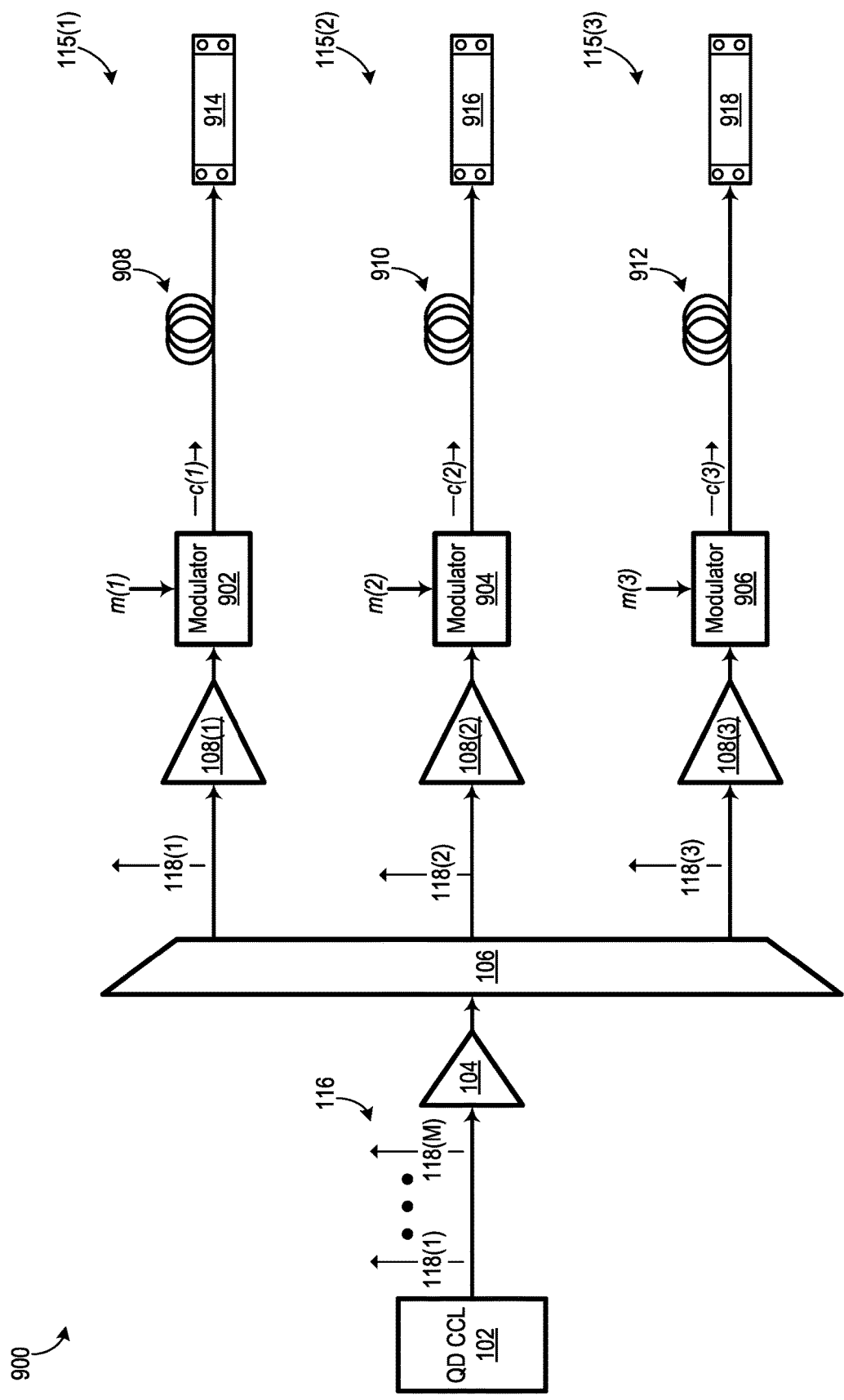
FIG. 9 is a block diagram of an embodiment of the FIG. 1 communication network supporting a plurality of servers.

FIGS. 7-9, discussed below, illustrate several example embodiments of communication network 100. It is understood, however, that communication network 100 is not limited to these example embodiments.

FIG. 7 is a block diagram of a communication network 700, which is another embodiment of communication network 100 implementing three communication links. Modulators 110(1), 110(2), and 110(3) of communication network 100 are embodied by modulators 702, 704, and 706, respectively, and optical communication mediums 112(1), 112(2), and 112(3) of communication network 100 are embodied by optical cables 708, 710, and 712, respectively, in communication network 700. Additionally, receivers 114(1), 114(2), and 114(3) of communication network 100 are embodied by an endpoint 714, a small cell wireless base station 716, and a macro cell wireless base station 718, in communication network 700. As discussed below, communication network 700 supports three different communication technologies, and communication network 700 is therefore a converged communication network.

Modulator 702 is, for example, a coherent driver modulator (CDM). Modulation signal m(1) of communication network 700 complies with a coherent optics communication protocol, such that communication signal c(1) is a coherent optics communication signal. In some embodiments, modulation signal m(1) complies with a 32 Gigabaud (GBd) dual polarization (DP) quadrature phase shift keying (QPSK) communication protocol. Applicant has found that this communication protocol may achieve high performance using an optical tone 118 generated by QD CCL 102 without requiring additional mode-locking elements. Endpoint 714 is, for example, a fiber node, a MTS, an ONU, an ONT, a DSLAM, a data center, a hyper scale, or an element within a data center or a hyper scale.

Modulator 704 is, for example, a Mach-Zehnder modulator (MZM). Modulator 704 is configured to simultaneously modulate each of consecutive optical tones 118(10) and 118(11) according to modulation signal m(2) to generate communication signal c(2), where modulation signal m(2) is real valued in this embodiment. In certain embodiments, modulation signal m(2) includes a 20 Megahertz (MHz), 16-quadrature amplitude modulation (QAM) baseband signal carried on a 40 MHz intermediate frequency (IF) signal). Optical tones 118(10) and 118(11) have, for example, a 25 GHz spacing. Modulation signal m(2) complies with a mmWave communication protocol in communication network 700, and communication signal c(2) is an analog communication signal complying with a mmWave communication protocol. According, communication signal c(2) is ready for broadcasting by wireless base station 716, i.e., wireless base station 716 need not convert communication signal c(2) to another format before broadcasting the communication signal. As such, the configuration of communication network 700 promotes simplicity, small size, low cost, and low energy consumption of wireless base station 716. In some embodiments, communication signal c(2) has a frequency ranging from 30 GHz to 300 GHz.

Modulation of two consecutive optical tones, i.e., optical tones 118(10) and 118(11), instead of a single optical tone 118, according to modulation signal m(2) helps achieve a 3 dB increase in intermediate frequency signal magnitude after beating. Additionally, configuring wavelength selection device 106 to direct two consecutive optical tones 118 to modulator 704, instead of directing only a single optical tone to modulator 704, promotes ease of design of wavelength selection device 106 as well as low filtering loss and filtering channel edge sharpness of wavelength selection device 106. However, communication network 700 could be modified so that wavelength selection device 106 directs only a single optical tone 118 to modulator 704.

Modulator 706 is, for example, a MZM. Modulator 706 is configured to modulate optical tone 118(5) according to modulation signal m(3) to generate communication signal c(3). Modulation signal m(3) complies with a CBRS communication protocol, and communication signal c(3) is an analog CBRS wireless communication signal, in communication network 700. In some embodiments, communication signal c(3) is a 20 MHz 64 QAM communication signal with a carrier frequency of 3.5 GHz, and communication signal c(3) may have a frequency ranging from 3.55 GHz to 3.70 GHz. Modulation signal m(3) is generated, for example, by upconverting a baseband signal to 3.5GHz and amplifying the upconverted signal. Similar to communication signal c(2) of communication network 700, communication signal c(3) is ready for broadcasting by wireless base station 718, and wireless base station 718 therefore need not convert communication signal c(3) to another format before broadcasting the communication signal. In an alternate embodiment of communication network 700, modulation signal m(3) complies with a C-Band wireless communication protocol, and communication signal c(3) is a C-Band wireless communication signal, e.g., having a frequency between 3.70 and 3.98 GHz.

FIG. 8 is a block diagram of a communication network 800, which is another embodiment of communication network 100 implementing three communication links 115. Modulators 110(1), 110(2), and 110(3) of communication network 100 are embodied by modulators 802, 804, and 806, respectively, and optical communication mediums 112(1), 112(2), and 112(3) of communication network 100 are embodied by optical cables 808, 810, and 812, respectively, in communication network 800. Additionally, receivers 114(1), 114(2), and 114(3) of communication network 100 are embodied by satellite ground stations 814, 816, and 818, in communication network 800.

Modulators 802, 804, and 806 are configured to modulate optical tones 118(1), 118(2), and 118(3) according to modulation signals m(1), m(2), and m(3) to generate communication signals c(1), c(2), and c(3), respectively. Each of modulation signals m(1), m(2), and m(3) complies with a satellite wireless communication protocol, and each of communication signals c(1), c(2), and c(3) is a satellite wireless communication signal, in communication network 800. In some embodiments, each of communication signals c(1), c(2), and c(3) in communication network 800 is an analog satellite wireless communication signal ready for broadcasting by satellite ground stations 814, 816, and 818, respectively, without requiring conversion to a different format.

FIG. 9 is a block diagram of a communication network 900, which is another embodiment of communication network 100 implementing three communication links 115. Modulators 110(1), 110(2), and 110(3) of communication network 100 are embodied by modulators 902, 904, and 906, respectively, and optical communication mediums 112(1), 112(2), and 112(3) of communication network 100 are embodied by optical cables 908, 910, and 912, respectively, in communication network 900. Additionally, receivers 114(1), 114(2), and 114(3) of communication network 100 are embodied by servers 914, 916, and 918, in communication network 900. Communication network 900 is implemented, for example, in a data center or in a hyperscale. Modulators 902, 904, and 906 are configured to modulate optical tones 118(1), 118(2), and 118(3) according to modulation signals m(1), m(2), and m(3) to generate communication signals c(1), c(2), and c(3), respectively. In some embodiments, one or more of modulation signals m(1), m(2), and m(3) complies with a coherent optics communication protocol.

Figure 10:
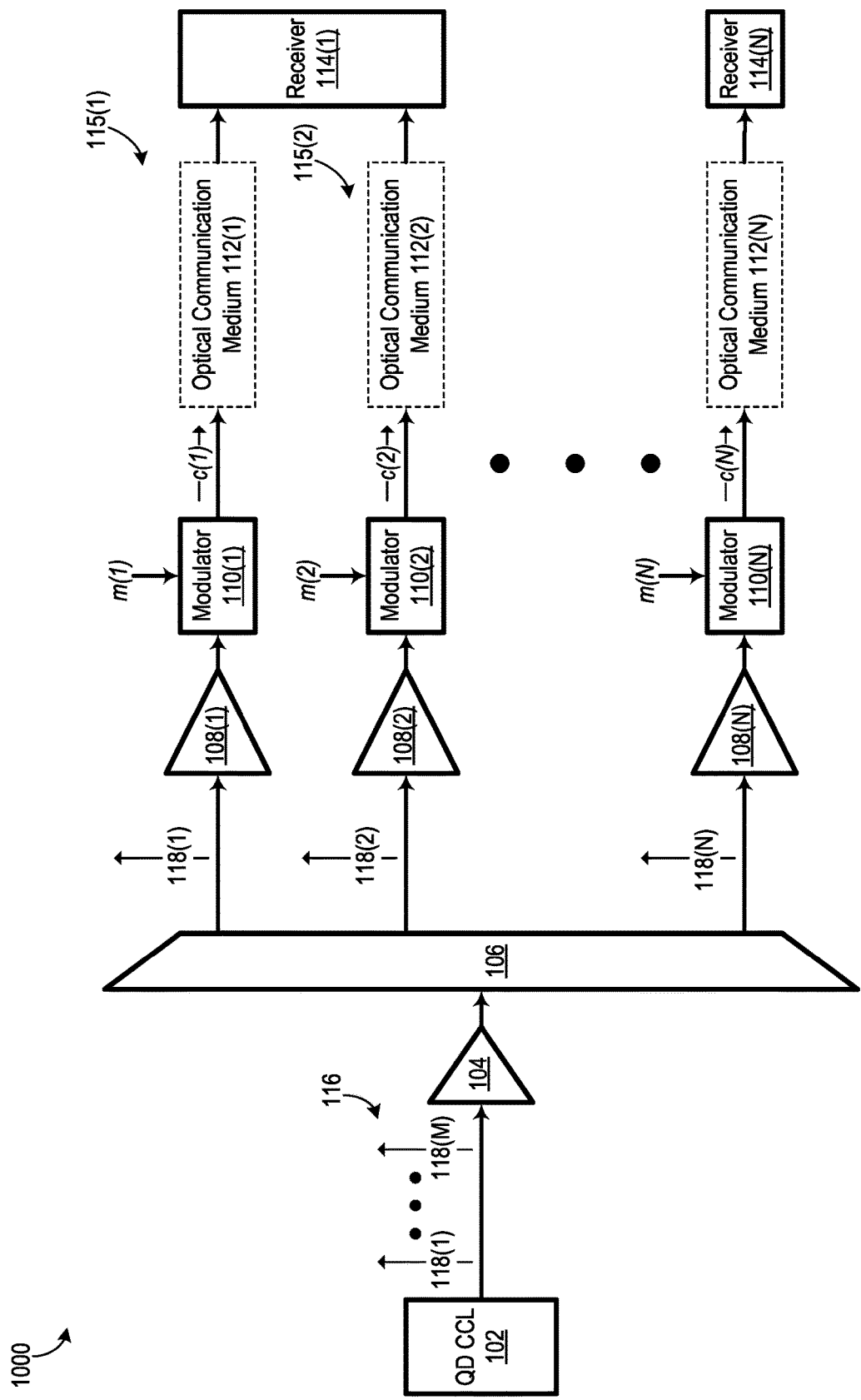
FIG. 10 is a block diagram of an alternate embodiment of the FIG. 1 communication network where two communication links support a common receiver.

Referring again to FIG. 1, communication network 100 could be modified so that two or more communication links serve a common receiver. For example, FIG. 10 is a block diagram of a communication network 1000, which is an alternate embodiment of communication network 100 where modulators 110(1) and 110(2) support respective communication links 115(1) and 115(2) with a common receiver 114(1). Communication links 115(1) and 115(2), for example, operate in parallel to obtain a greater data transmission capacity than would be possible with a single communication link. As another example, one of communication links 115(1) or 115(2) may serve as a backup communication link to the other communication link 115(1) or 115(2).

Figure 11:
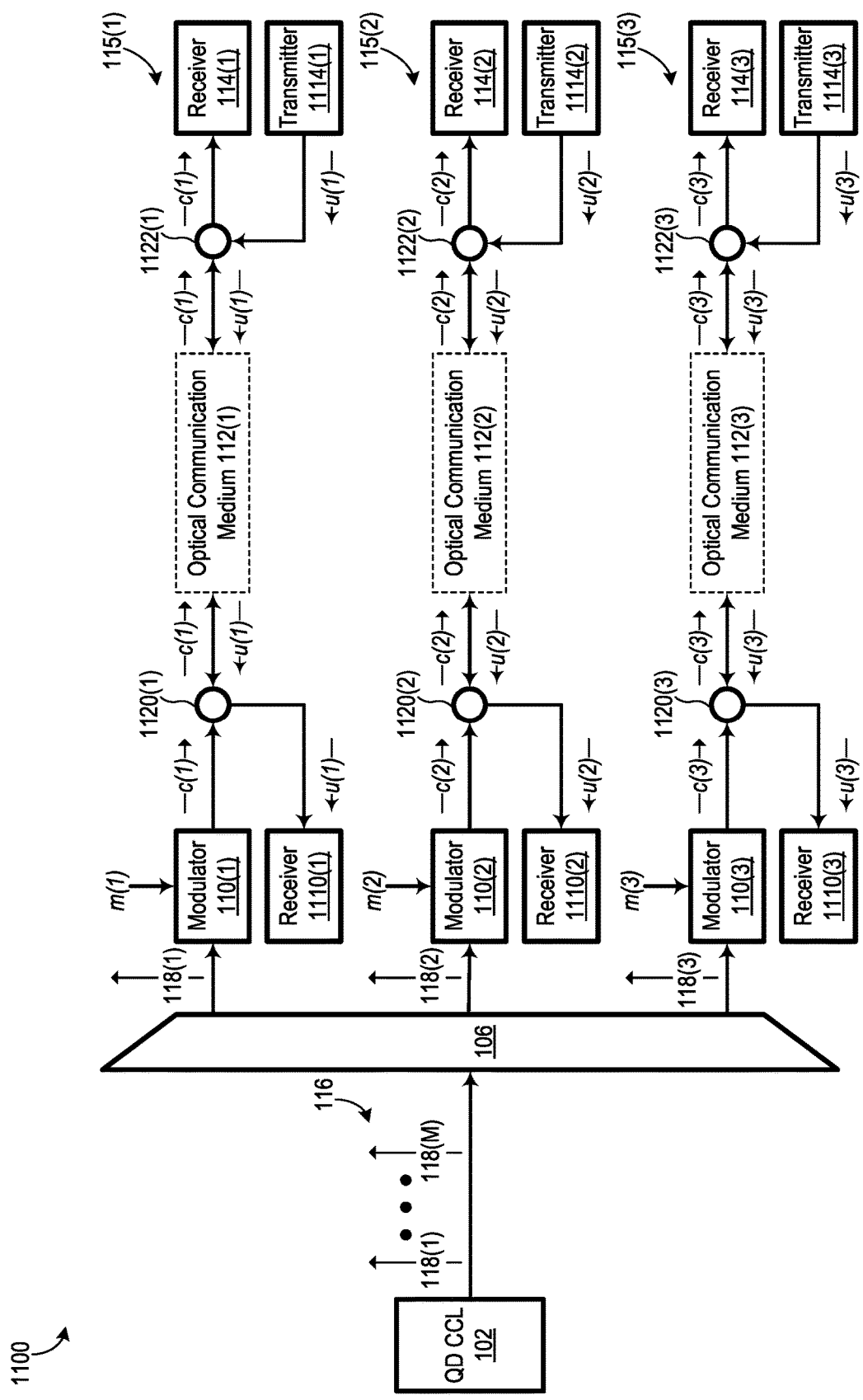
FIG. 11 is a block diagram of an alternate embodiment of the FIG. 1 communication network that is configured to support two-way communication.

While the communication networks discussed above are configured for one-way data transmission, any of the communication networks disclosed herein could be modified for two-way data transmission. For example, FIG. 11 is a block diagram of a communication network 1100, which is an alternate embodiment of communication network 100 that is configured for two-way communication. Communication network 1100 includes N receivers 1110, N optical circulators 1120, N optical circulators 1122, and N transmitters 1114, in addition to the elements of communication network 100. Amplifiers 104 and 108 are not shown in FIG. 11 for illustrative clarity, but it is understood that communication network 1100 may include these elements in the same or similar topological locations as illustrated in FIG. 1. While N is equal to three in communication network 1100, communication network 1100 could be modified so that N is a different positive integer.

Communication network 1100 transmits communication signals c from modulators 110 to receivers 114 in the manner discussed above with respect to FIG. 1, except that each communication signal c further traverses an optical circulator 1120 and an optical circulator 1122 on the way to its respective receiver 114. Additionally, each transmitter 1114 is configured to generate a respective uplink communication signal u, and communication network 1100 is configured to transmit each uplink communication signal u to a respective receiver 1110. For example, communication network 1100 transmits uplink communication signal u(1) from transmitter 1114(1) to receiver 1110(1) via optical circulator 1122(1), optical communication medium 112(1), and optical circulator 1120(1). As another example, communication network 1100 transmits communication signal u(2) from transmitter 1114(2) to receiver 1110(2) via optical circulator 1122(2), optical communication medium 112(2), and optical circulator 1120(2).

Each optical circulator 1120 is configured to (1) direct a communication signal c from a respective modulator 110 to a respective optical communication medium 112 and (2) direct an uplink communication signal u from its respective optical communication medium 112 to a respective receiver 1110. Additionally, each optical circulator 1122 is configured to (1) direct a communication signal c from a respective optical communication medium 112 to a respective receiver 114 and (2) direct an uplink communication signal u from a respective transmitter 1114 to its respective optical communication medium 112. In some embodiments, transmitters 1114 operate independently of QD CCL 102. However, in some other embodiments, at least one transmitter 114 uses an optical tone 118 generated by QD CCL 102, such as for a seed light source of a laser (not shown) within the transmitter.

Figure 12:
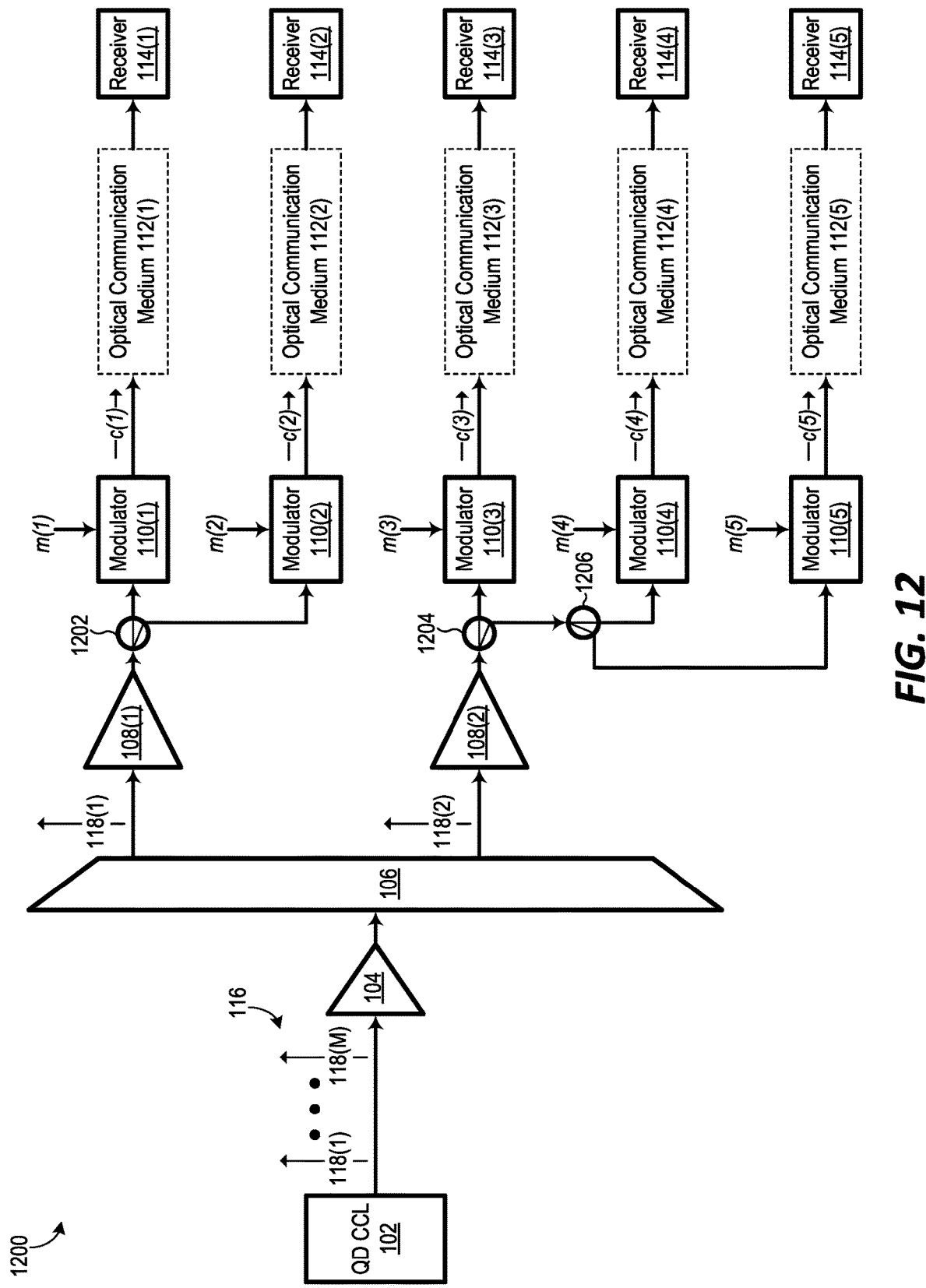
FIG. 12 is a block diagram of an alternate embodiment of the FIG. 1 communication network that is configured to transmit optical tones on a point-to-multipoint basis.

The communication networks discussed above transmit optical tones on a point-to-point basis, i.e., each optical tone 118 is transmitted to at most one receiver. However, any of the communication networks disclosed herein could be modified to transmit optical tones 118 on a point-to-multi-point basis, i.e., so that at least one optical tone 118 is transmitted to two or more receivers. For example, FIG. 12 is a block diagram of a communication network 1200, which is an alternate embodiment of communication network 100 that is configured to transmit optical tones on a point-to-multipoint basis. Specifically, an optical splitter 1202 splits optical tone 118(1) into two components, such that each of receivers 114(1) and 114(2) receives optical tone 118(1) via a respective modulator 110 and a respective optical communication medium 112. Additionally, optical splitters 1204 and 1206 collectively split optical tone 118(2) into three components, such that each of receivers 114(3), 114(4), and 114(5) receives optical tone 118(2) via a respective modulator 110 and a respective optical communication medium 112. In some embodiments of communication network 1200, modulation signals m comply with a passive optical network communication protocol, e.g., a EPON communication protocol, a GPON communication protocol, or a modification, extension, or evolution of either of these communication protocols. The topology of communication network 1200 could be modified without departing from the scope hereof. For example, communication network 1200 could be modified to form additional branches.

Figure 13:
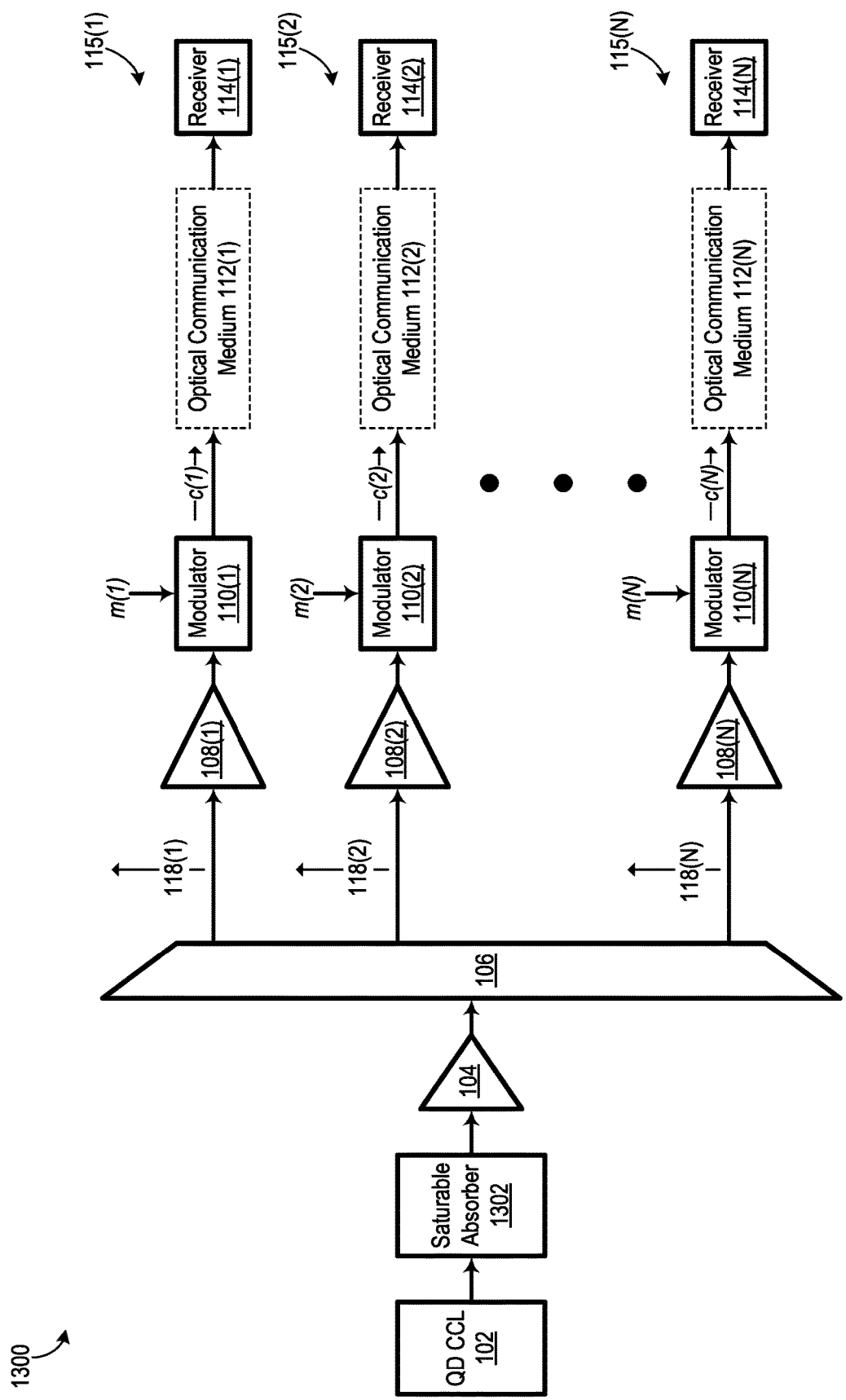
FIG. 13 is an alternate embodiment of the FIG. 1 communication network further including a saturable absorber.

Referring again to FIG. 1, while QD CCL 102 advantageously does not require external elements to generate a stable optical frequency comb due to the self-mode-locking nature of QD CCL 102, additional elements could be added to QD CCL 102 without departing from the scope hereof. For example, FIG. 13 is a block diagram of a communication network 1300, which is an alternate embodiment of communication network 100 further including a saturable absorber 1302 optically coupled between QD CCL 102 and amplifier 104. Saturable absorber 1302 improves characteristics of the optical frequency comb generated by QD CCL 102, such as to decrease line width of optical tones 118. Communication network 1300 otherwise operates in the same manner as communication network 100.

Figure 14:
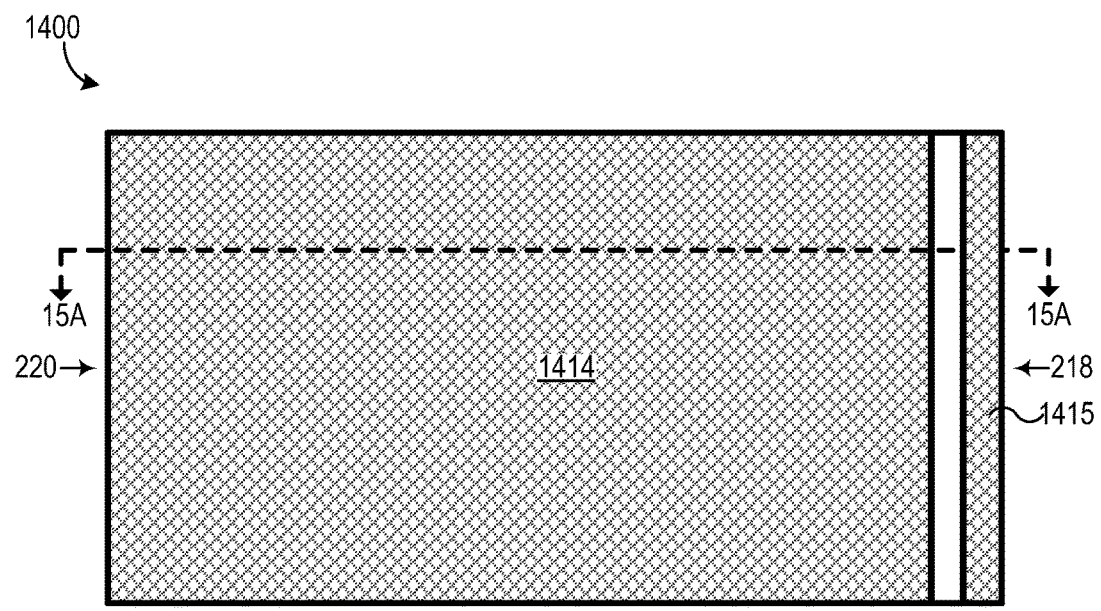
FIG. 14 is a top plan view of an alternate embodiment of the FIG. 2 QD CCL including an additional electrode.
Figure 15:
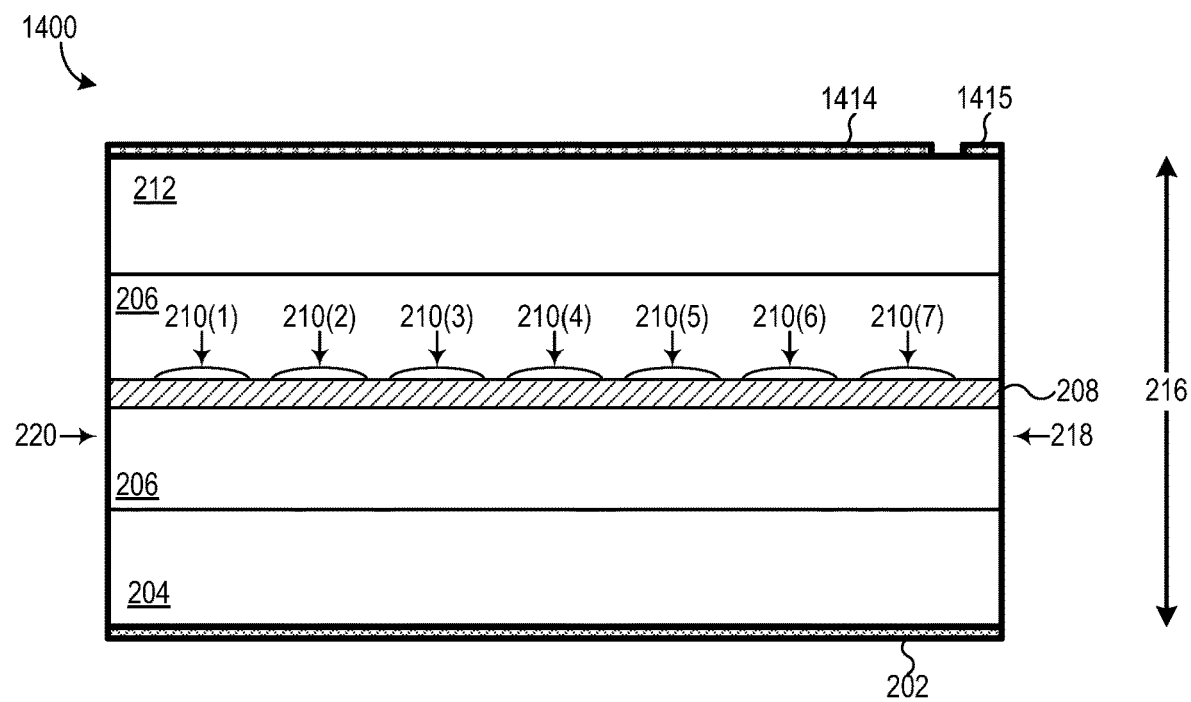
FIG. 15 is a cross-sectional view of the FIG. 14 QD CCL.

QD CCL 102 could also be modified to include an internal saturable absorber. For example, FIG. 14 is a top plan view of a QD CCL 1400, and FIG. 15 is a cross-sectional view of QD CCL 1400 take along line 15A-15A of FIG. 14. QD CCL 1400 is an alternate embodiment of QD CCL 200 of FIG. 2 where electrode 214 is replaced with two separate electrodes 1414 and 1415. Electrode 1414 may be positively electrically biased with respect to electrode 202 to cause lasing in QD CCL 1400, and electrode 1415 may be negatively electrically biased with respect to electrode 202 to create a saturable absorber within waveguide core 206. The configuration of electrodes 202, 1414, and/or 1415 may vary without departing from the scope hereof.

Experimental Results

Applicant has modeled an embodiment of communication network 700 having the following specifications: (1) amplifier 104 is an EFDA, (2) wavelength selection device 106 is a WSS, (3) communication signal c(1) is a 32-GBd DP-QPSK communication signal, (4) endpoint 714 is configured to mix communication signal c(1) with a local oscillator and detect the resulting signal via an integrated coherent receiver, (5) optical tones 118(10) and 118(11) have 25 GHz spacing, (6) communication signal c(2) is a 20 MHz 16-QAM carried 40 MHz intermediate frequency with a carrier frequency of 25 GHz, (7) wireless base station 716 includes a photodetector, an amplifier, and a horn antenna, (8) a wireless signal generated by wireless base station 716 is received by a UE including a horn antenna, (9) optical tone 118(5) is modulated by modulator 706 with electrical up-conversion at 3.5 GHz, (10) communication signal c(3) has baseband of 20 MHz 64-QAM and carrier frequency of 3.5 GHz, (11) wireless base station 718 includes a photodetector, an amplifier, and a horn antenna, (12) a wireless signal generated by wireless base station 718 is received by a UE including a horn antenna, (13) optical cable 708 is a 50 Kilometer (Km) long single-mode-fiber (SMF) optical cable, and (13) each of optical cables 710 and 712 is 20 Km long SMF optical cable.

Figure 16:
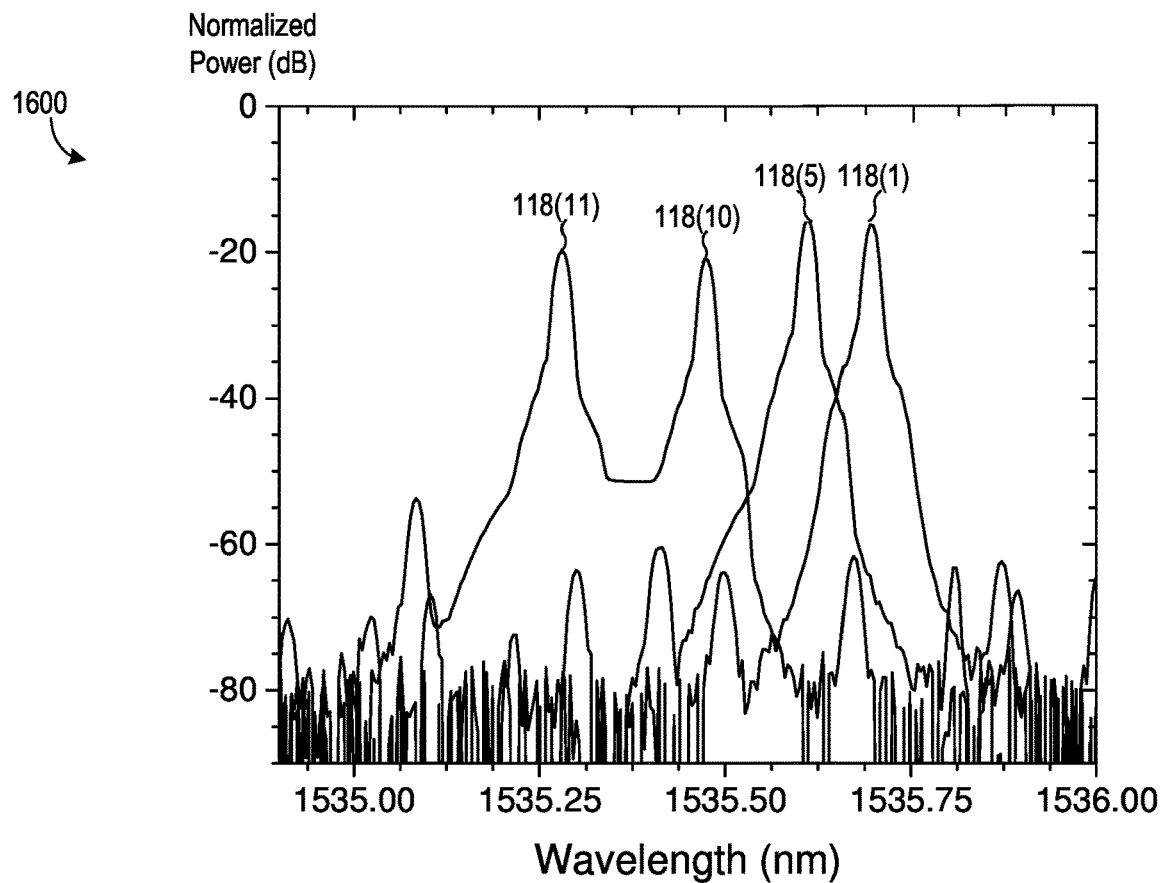
FIG. 16 is a graph of normalized power versus wavelength for optical tones of a modeled embodiment of the FIG. 7 communication network
Figure 17:
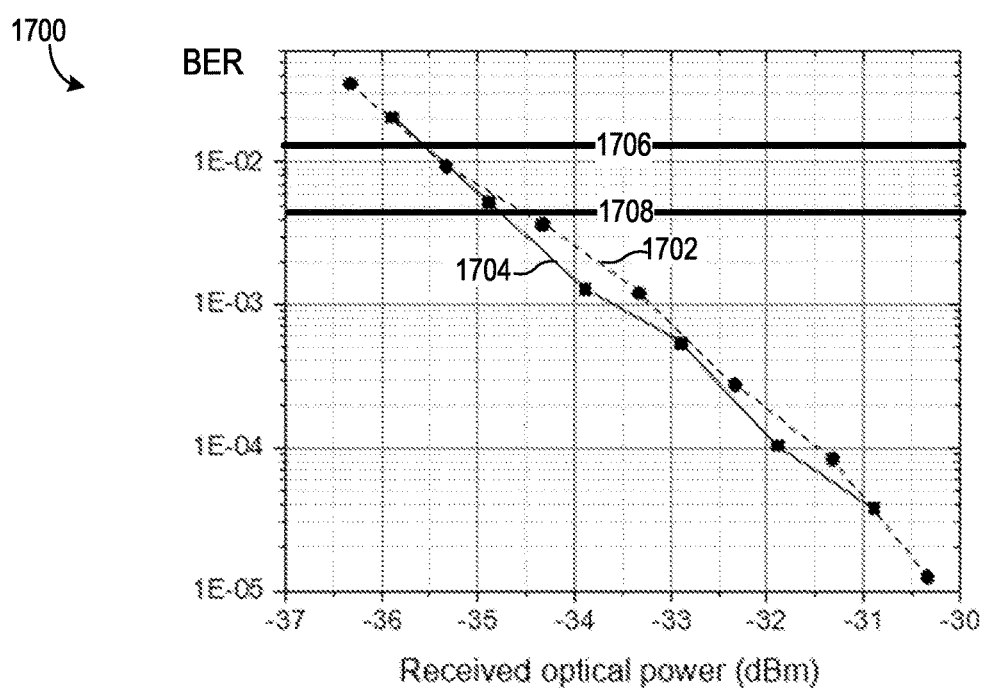
FIG. 17 is a graph of bit error rate (BER) versus received optical power of a coherent optical wireline communication link of the modeled embodiment of the FIG. 7 communication network.

FIG. 16 is a graph of normalized power versus wavelength of optical tones 118(1), 118(5), 118(10), and 118(11), as outputted by wavelength selection device 106, in the modeled embodiment of communication network 700. As evident from FIG. 16, optical tones 118(1), 118(5), 118(10), and 118(11) achieve a high signal-to-noise ratio of approximately 40 dB. FIG. 17 is a graph of bit error rate (BER) as a function of received optical power, for endpoint 714 in the modeled embodiment of communication network 700. Curve 1702 corresponds to data being transmitted from modulator 702 to endpoint 714 through optical cable 708, and curve 1704 corresponds to endpoint 714 and modulator 702 being back-to-back, such that optical cable 708 is omitted. Graph 1700 further includes (1) a curve 1706 representing a concatenated soft-decision (SD) forward error correction (FEC) threshold (BER=1.2 E-2) and (2) a curve 1708 representing a staircase hard-decision (HD) FEC threshold (BER=4.5 E-3). As evident from FIG. 17, the modeled embodiment of communication network 1700 can obtain high coherent optical wireline communication performance.

Figure 18:
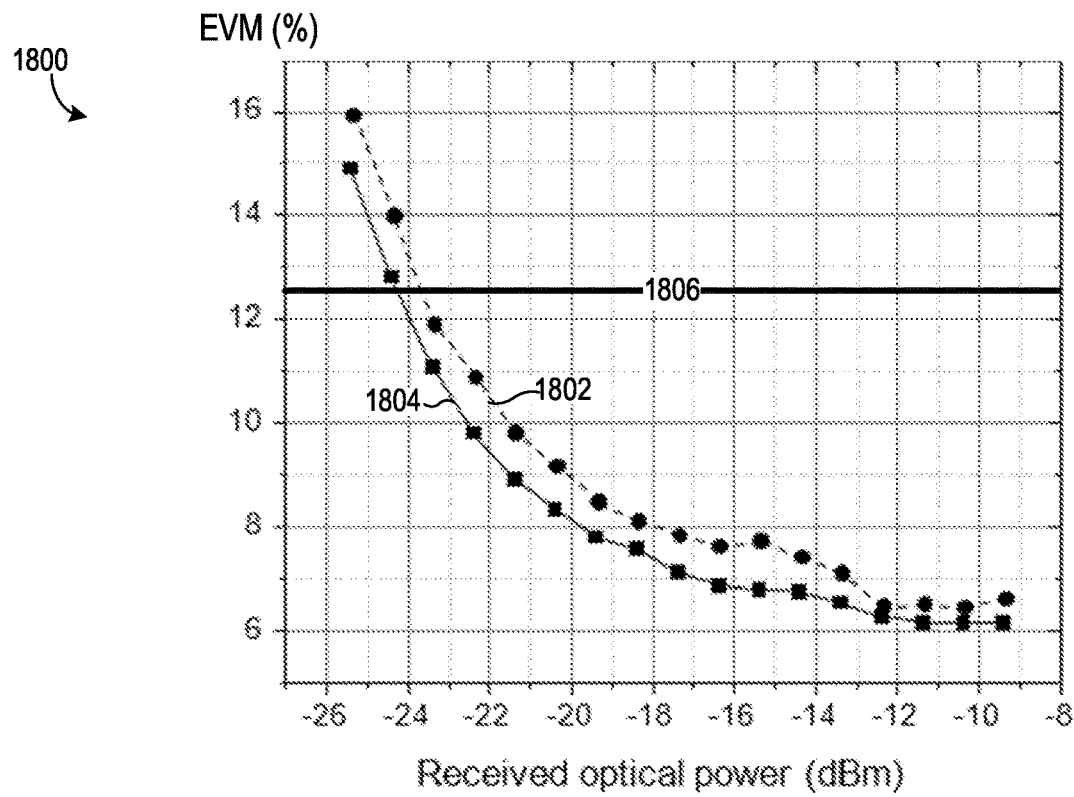
FIG. 18 is a graph of error vector magnitude (EVM) versus received optical power at a first wireless base station of the modeled embodiment of the FIG. 7 communication network.

FIG. 18 is a graph 1800 of error vector magnitude (EVM) versus received optical power at wireless base station 716 in the modeled embodiment of communication network 700. Curve 1802 corresponds to data being transmitted from modulator 704 to wireless base station 716 through optical cable 710, and curve 1804 corresponds to wireless base station 716 and modulator 704 being back-to-back, such that optical cable 710 is omitted. Graph 1800 further includes a curve 1806 representing a maximum EVM of 12.5%, as specified by the 3$^{rd}$ Generation Partnership Project (3GPP) for a 16-QAM LTE signal. As evident from FIG. 18, use of optical cable 710 introduced approximately a 1 dB penalty. However, the EVM is below curve 1806 for the majority of received optical power values.

Figure 19:
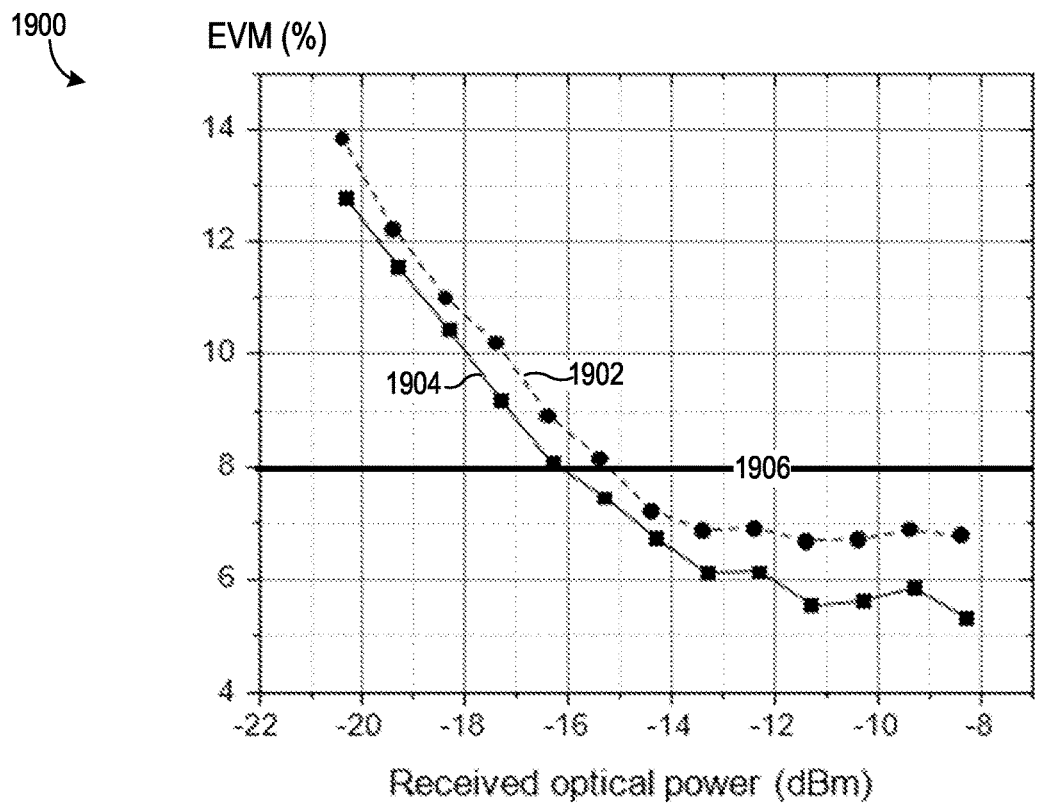
FIG. 19 is a graph of EVM versus received optical power at a second wireless base station of the modeled embodiment of the FIG. 7 communication network.

FIG. 19 is a graph 1900 of EVM received optical power at wireless base station 718 in the modeled embodiment of communication network 700. Curve 1902 corresponds to data being transmitted from modulator 706 to wireless base station 718 through optical cable 712, and curve 1904 corresponds to wireless base station 718 and modulator 706 being back-to-back, such that optical cable 712 is omitted. Graph 1900 further includes a curve 1906 representing a maximum EVM of 8%, as specified by the 3GPP for a 64-QAM LTE signal. Similar to the scenario of FIG. 18, use of optical cable 712 introduced approximately a 1 dB penalty. However, the EVM is below curve 1906 for the majority of received optical power values.

Combinations of Features

Features described above may be combined in various ways without departing from the scope hereof. The following examples illustrate some possible combinations.

(A1) A method for generating optical communication signals in a communication network includes (1) generating at least a first optical tone and a second optical tone using a quantum dot (QD) coherent comb laser (CCL), the first and second optical tones having different respective wavelengths, (2) modulating the first optical tone according to a first modulation signal to generate a first communication signal, and (3) modulating the second optical tone according to a second modulation signal to generate a second communication signal.

(A2) In the method denoted as (A1), the QD CCL may be a self-mode-locking laser.

(A3) In any one of the methods denoted as (A1) and (A2), the first modulation signal may comply with a wireline communication protocol.

(A4) In the method denoted as (A3), the wireline communication protocol may be a coherent optics communication protocol.

(A5) In any one of the methods denoted as (A1) through (A4), the second modulation signal may comply with a wireless communication protocol.

(A6) In the method denoted as (A5), the wireless communication protocol may be selected from the group consisting of a millimeter wave wireless communication protocol, a citizens broadband radio service (CBRS) wireless communication protocol, and a C-B and wireless communication protocol.

(A7) In any one of the methods denoted as (A5) and (A6), the second communication signal may be an analog communication signal.

(A8) Any one of the methods denoted as (A1) through (A7) may further include (1) using the QD CCL, generating a third optical tone having a different wavelength than each of the first and second optical tones and (2) modulating the third optical tone according to the second modulation signal to further generate the second communication signal.

(A9) Any one of the methods denoted as (A1) and (A2) may further include (1) using the QD CCL, generating a third optical tone having a different wavelength than each of the first and second optical tones and (2) modulating the third optical tone according to a third modulation signal to generate a third communication signal.

(A10) In the method denoted as (A9), the first modulation signal may comply with a wireline communication protocol, the second modulation signal may comply with a first wireless communication protocol, and the third modulation signal may comply with a second wireless communication protocol.

(A11) Any one of the methods denoted as (A1) through (A10) may further include (1) directing the first optical tone to a first modulator using a wavelength selective device and (2) directing the second optical tone to a second modulator using the wavelength selective device.

(A12) In the method denoted as (A11), the wavelength selective device may include a wavelength selective switch.

(A13) In any one of the methods denoted as (A11) and (A12), modulating the first optical tone according to the first modulation signal may include modulating the first optical tone using the first modulator, and modulating the second optical tone according to the second modulation signal may include modulating the second optical tone using the second modulator.

(B1) A method for operating a communication network includes (1) generating at least a first optical tone and a second optical tone using a quantum dot (QD) coherent comb laser (CCL), the first and second optical tones having different respective wavelengths, (2) modulating the first optical tone according to a first modulation signal to generate a first communication signal, (3) modulating the second optical tone according to a second modulation signal to generate a second communication signal, (4) transmitting the first communication signal to a first receiver via a first optical communication medium, and (5) transmitting the second communication signal to a second receiver via a second optical communication medium.

(B2) In the method denoted as (B1), the first modulation signal may comply with a wireline communication protocol, and the second modulation signal may comply with a wireless communication protocol.

(B3) In any one of the methods denoted as (B1) and (B2), the second communication signal may be an analog wireless communication signal, and the second receiver may include a wireless base station.

(B4) In the method denoted as (B3), the analog wireless communication signal may be selected from the group consisting of a millimeter wave wireless communication signal, a citizens broadband radio service (CBRS) wireless communication signal, and a C -Band wireless communication signal.

(B5) Any one of the methods denoted as (B1) through (B4) may further include (1) using the QD CCL, generating a third optical tone having a different wavelength than each of the first and second optical tones and (2) modulating the third optical tone according to the second modulation signal to further generate the second communication signal.

(B6) In any one of the methods denoted as (B1) through (B5), the first optical communication medium may include at least one of an optical cable and free space optics, and the second optical communication medium may include at least one of an optical cable and free space optics.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for generating optical communication signals in a communication network, the method comprising:
generating at least a first optical tone and a second optical tone using a quantum dot (QD) coherent comb laser (CCL), the first and second optical tones having different respective wavelengths, the QD CCL being a self-mode-locking laser;
modulating the first optical tone according to a first modulation signal to generate a first communication signal; and
modulating the second optical tone according to a second modulation signal to generate a second communication signal.

2. The method of claim 1, wherein the first modulation signal complies with a wireline communication protocol.

3. The method of claim 2, wherein the wireline communication protocol is a coherent optics communication protocol.

4. The method of claim 2, wherein the second modulation signal complies with a wireless communication protocol.

5. The method of claim 4, the wireless communication protocol is selected from the group consisting of a millimeter wave wireless communication protocol, a citizens broadband radio service (CBRS) wireless communication protocol, and a C-Band wireless communication protocol.

6. The method of claim 4, wherein the second communication signal is an analog communication signal.

7. The method of claim 4, further comprising:
using the QD CCL, generating a third optical tone having a different wavelength than each of the first and second optical tones; and
modulating the third optical tone according to the second modulation signal to further generate the second communication signal.

8. The method of claim 1, further comprising:
directing the first optical tone to a first modulator using a wavelength selective device; and
directing the second optical tone to a second modulator using the wavelength selective device.

9. The method of claim 8, wherein the wavelength selective device comprises a wavelength selective switch.

10. The method of claim 8, wherein:
modulating the first optical tone according to the first modulation signal comprises modulating the first optical tone using the first modulator; and
modulating the second optical tone according to the second modulation signal comprises modulating the second optical tone using the second modulator.

11. The method of claim 1, further comprising amplifying each of the first and second optical tones.

12. The method of claim 1, further comprising:
using the QD CCL, generating a third optical tone having a different wavelength than each of the first and second optical tones; and
modulating the third optical tone according to a third modulation signal to generate a third communication signal.

13. The method of claim 12, wherein:
the first modulation signal complies with a wireline communication protocol;
the second modulation signal complies with a first wireless communication protocol; and
the third modulation signal complies with a second wireless communication protocol.

14. A method for operating a communication network, the method comprising:
generating at least a first optical tone and a second optical tone using a quantum dot (QD) coherent comb laser (CCL), the first and second optical tones having different respective wavelengths, the QD CCL being a self-mode-locking laser;
modulating the first optical tone according to a first modulation signal to generate a first communication signal;
modulating the second optical tone according to a second modulation signal to generate a second communication signal;
transmitting the first communication signal to a first receiver via a first optical communication medium; and
transmitting the second communication signal to a second receiver via a second optical communication medium.

15. The method of claim 14, wherein:
the first modulation signal complies with a wireline communication protocol; and
the second modulation signal complies with a wireless communication protocol.

16. The method of claim 15, wherein:
the second communication signal is an analog wireless communication signal; and
the second receiver comprises a wireless base station.

17. The method of claim 15, wherein the analog wireless communication signal is selected from the group consisting of a millimeter wave wireless communication signal, a citizens broadband radio service (CBRS) wireless communication signal, and a C-Band wireless communication signal.

18. The method of claim 14, further comprising:
using the QD CCL, generating a third optical tone having a different wavelength than each of the first and second optical tones; and
modulating the third optical tone according to the second modulation signal to further generate the second communication signal.

19. The method of claim 14, wherein:
the first optical communication medium comprises at least one of an optical cable and free space optics; and
the second optical communication medium comprises at least one of an optical cable and free space optics.

* * * * *